(12) United States Patent
Davis

(10) Patent No.: US 6,972,554 B1
(45) Date of Patent: Dec. 6, 2005

(54) UNIVERSAL AIRCRAFT GENERATOR ELECTRICAL BENCH TEST APPARATUS

(75) Inventor: Randall D. Davis, Claremore, OK (US)

(73) Assignee: Honeywell International, Inc., Morristown, NJ (US)

( * ) Notice: Subject to any disclaimer, the term of this patent is extended or adjusted under 35 U.S.C. 154(b) by 0 days.

(21) Appl. No.: 10/897,489

(22) Filed: Jul. 26, 2004

(51) Int. Cl.[7] ............................................. G01R 13/20
(52) U.S. Cl. .................................. 324/121 R; 324/772
(58) Field of Search ......................... 324/121 R, 158.1, 324/765, 754, 761, 762, 772; 322/99; 318/490–494; 702/66, 67, 76

(56) References Cited

U.S. PATENT DOCUMENTS

| | | | |
|---|---|---|---|
| 3,798,515 A | | 3/1974 | DiGiacomo |
| 3,890,836 A | * | 6/1975 | McKenzie et al. ............ 73/168 |
| 3,921,451 A | | 11/1975 | DiGiacomo |
| 4,070,624 A | | 1/1978 | Taylor |
| 4,350,953 A | * | 9/1982 | Best et al. .................. 368/115 |
| 4,651,086 A | | 3/1987 | Domenichini et al. |
| 4,658,213 A | | 4/1987 | Finley |
| 4,682,103 A | | 7/1987 | DeNardis |
| 4,687,990 A | | 8/1987 | Finch |
| 4,965,513 A | * | 10/1990 | Haynes et al. .............. 324/772 |
| 5,406,836 A | | 4/1995 | Smith |
| 5,550,485 A | | 8/1996 | Falk |
| 5,557,216 A | | 9/1996 | Dailey et al. |
| 5,684,718 A | | 11/1997 | Jenkins et al. |
| 5,928,022 A | | 7/1999 | Moeller |
| 6,051,987 A | * | 4/2000 | Stokes ....................... 324/772 |
| 6,195,617 B1 | * | 2/2001 | Miller ....................... 702/125 |
| 6,392,419 B1 | | 5/2002 | Divljakovic et al. |

* cited by examiner

Primary Examiner—Vinh Nguyen
Assistant Examiner—Tung X. Nguyen
(74) Attorney, Agent, or Firm—Ingrassia Fisher & Lorenz

(57) ABSTRACT

An electrical test box is provided for selectively connecting a generator to one of a plurality of test devices where the generator has a plurality of circuits. The electrical test box includes an input connector that is adapted to electrically couple to one or more of the circuits. The box also includes one or more pair of test jacks and a circuit select switch and a test select switch. The circuit select switch has a plurality of input contacts and an output contact. The contacts are electrically coupled to the input connector and configured to selectively electrically couple the circuit select switch output contact to a generator circuit. The test select switch is electrically coupled between the circuit select switch output contact and at least one of the test jacks and is configured to selectively couple the circuit select switch output contact to one test jack of the test jack pair.

10 Claims, 5 Drawing Sheets

UNIVERSAL AIRCRAFT GENERATOR ELECTRICAL BENCH TEST APPARATUS

FIELD OF THE INVENTION

The present invention relates to generator testing and, more particularly, to a test box that is useful for performing electrical tests on multiple types of generators.

BACKGROUND OF THE INVENTION

Generators are used for myriad applications, for example, in gas turbine engines, such as those found in aircraft, ships, and some terrestrial vehicles. These generators may include three separate brushless generators, namely, a permanent magnet generator (PMG), an exciter, and a main generator. Each of these generators may include rotors and stators and numerous windings. When the rotor rotates, currents are induced in at least one of the numerous stator windings.

Periodically, the generator may need to undergo routine maintenance and testing to determine the electrical integrity of the windings and/or the circuits disposed therein. Accordingly, the generator first may be removed from the engine and various test equipment may be connected to the generator via leads or probes. Typically, such connections between the leads and generator are performed manually.

Although the methods of testing the generator circuits and windings have been effective, these methods suffer from certain drawbacks. For example, disassembly of the generator and subsequent performance of the multiple test parameters may be labor-intensive and time-consuming. Additionally, because each pin-to-pin connection and each test is performed manually, the likelihood of human error increases. Moreover, because each generator varies in size and configuration, each may need to be disassembled and tested individually.

Hence, there is a need for a device for testing a generator and a method for using the device that do not require disassembly of the generator, and/or is less labor-intensive, and/or less time-consuming, and/or capable of being used for testing generators of various sizes and configurations. The present invention addresses one or more of these needs.

SUMMARY OF THE INVENTION

The present invention provides an electrical test box for selectively connecting a generator to one of a plurality of test devices, the generator having a plurality of circuits.

In one embodiment, and by way of example only, the electrical test box includes an input connector, one or more pair of test jacks, a circuit select switch, and a test select switch. The input connector is adapted to electrically couple to one or more of the circuits. The circuit select switch has a plurality of input contacts and an output contact. The circuit select switch input contacts are electrically coupled to the input connector and are configured to selectively electrically couple the circuit select switch output contact to a generator circuit. The test select switch is electrically coupled between the circuit select switch output contact and at least one of the test jacks. The test select switch is configured to selectively couple the circuit select switch output contact to one test jack of the test jack pair.

Other independent features and advantages of the preferred electrical test box will become apparent from the following detailed description, taken in conjunction with the accompanying drawings which illustrate, by way of example, the principles of the invention.

DETAILED DESCRIPTION OF A PREFERRED EMBODIMENT

Before proceeding with the detailed description, it is to be appreciated that the present invention is not limited to use in conjunction with a specific type of electrical machine. Thus, although the present embodiment is, for convenience of explanation, depicted and described as being employed with a brushless AC (alternating current) generator, it will be appreciated that it can be employed with other AC generator designs needed in specific applications.

Figure 1:
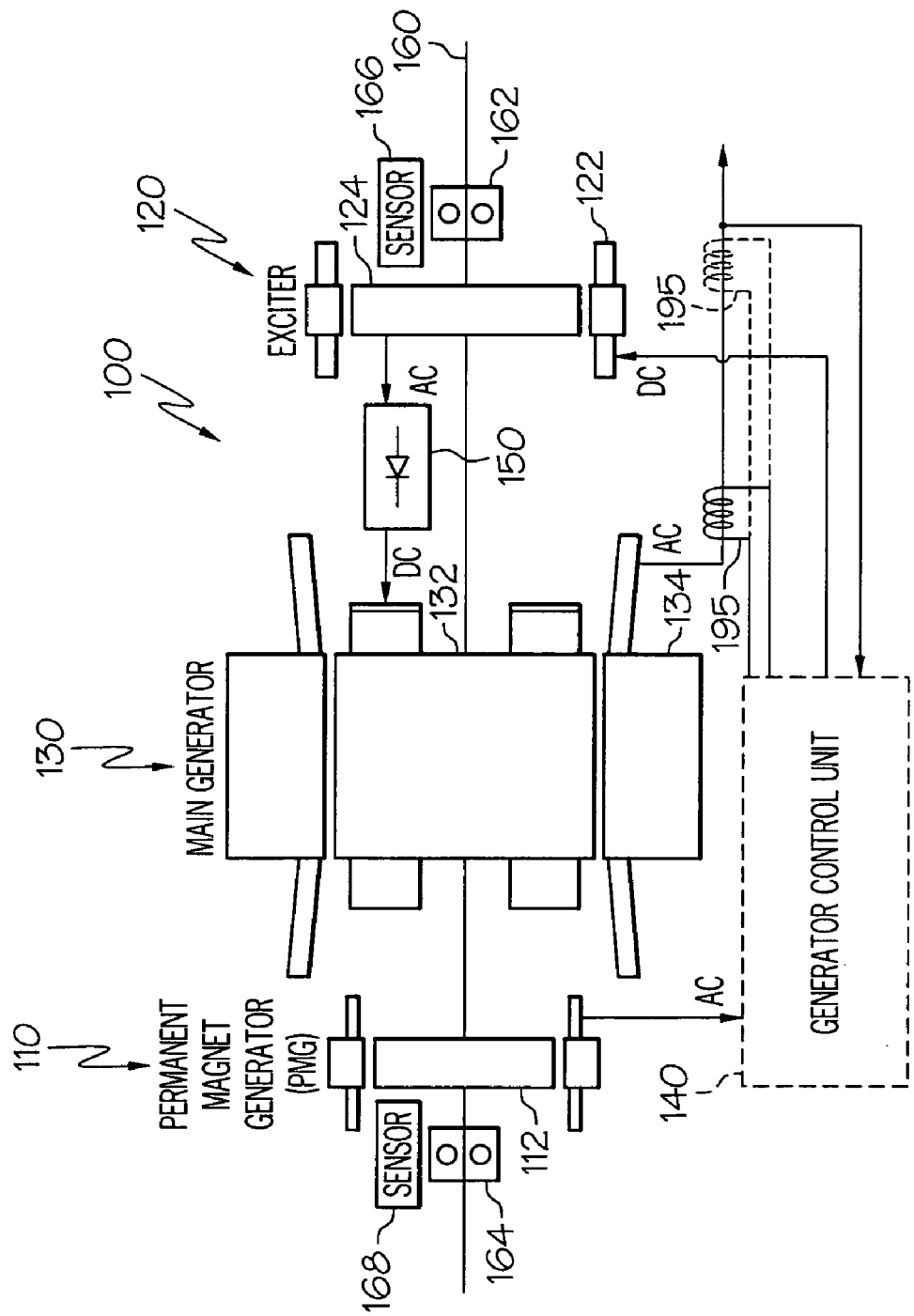
FIG. 1 is a functional schematic block diagram of an exemplary high speed generator system.

Turning now to the description, and with reference first to FIG. 1, a functional schematic block diagram of an exemplary high speed generator system 100 for use with a gas turbine engine such as that in an aircraft is depicted. This exemplary generator system 100, which is commonly known as a brushless AC generator, includes a permanent magnet generator (PMG) 110, an exciter 120, a main generator 130, a generator control unit 140, and one or more rectifier assemblies 150. During operation, a rotor 112 of the PMG 110, a rotor 124 of the exciter 120, and a rotor 132 of the main generator 130 may all rotate at the same speed. In one embodiment, the rotational speed may be, for example, in the range of about 12,000 to about 24,000 r.p.m., or greater. As the PMG rotor 112 rotates, the PMG 110 generates and supplies AC power to the generator control unit 140, which in turn is rectified and supplied as direct current (DC) power to a stator 122 of the exciter 120. The exciter rotor 124 in turn supplies AC power to the rectifier assemblies 150. The output from the rectifier assemblies 150 is DC power and is supplied to the main generator rotor 132. As the main generator rotor 132 rotates, magnetic flux lines are created about alternating north and south poles which induce an AC voltage into the main generator stator 134.

The generator system 100 is capable of providing output power at a variety of power levels and over a variety of frequency ranges. Further, typically the output power from the main generator stator 134 is three-phase AC power. The generator control unit 140 can regulate the power output based upon monitoring signals provided to it from monitoring devices 195 such as, for example, one or more current transformers (CTs). In the depicted embodiment, the PMG rotor 112, the exciter rotor 124, and the main generator rotor 132 all rotate along a single axis at the same rotational speed, and are preferably mounted on a common shaft assembly 160. It will be appreciated, however, that in other embodiments the PMG rotor 112 may rotate along a different axis. Moreover, the relative positioning of the PMG 110, the exciter 120, and the main generator 130 can be modified in different embodiments such that the exciter 120 is physically between the PMG 110 and the main generator 130.

Figure 2:
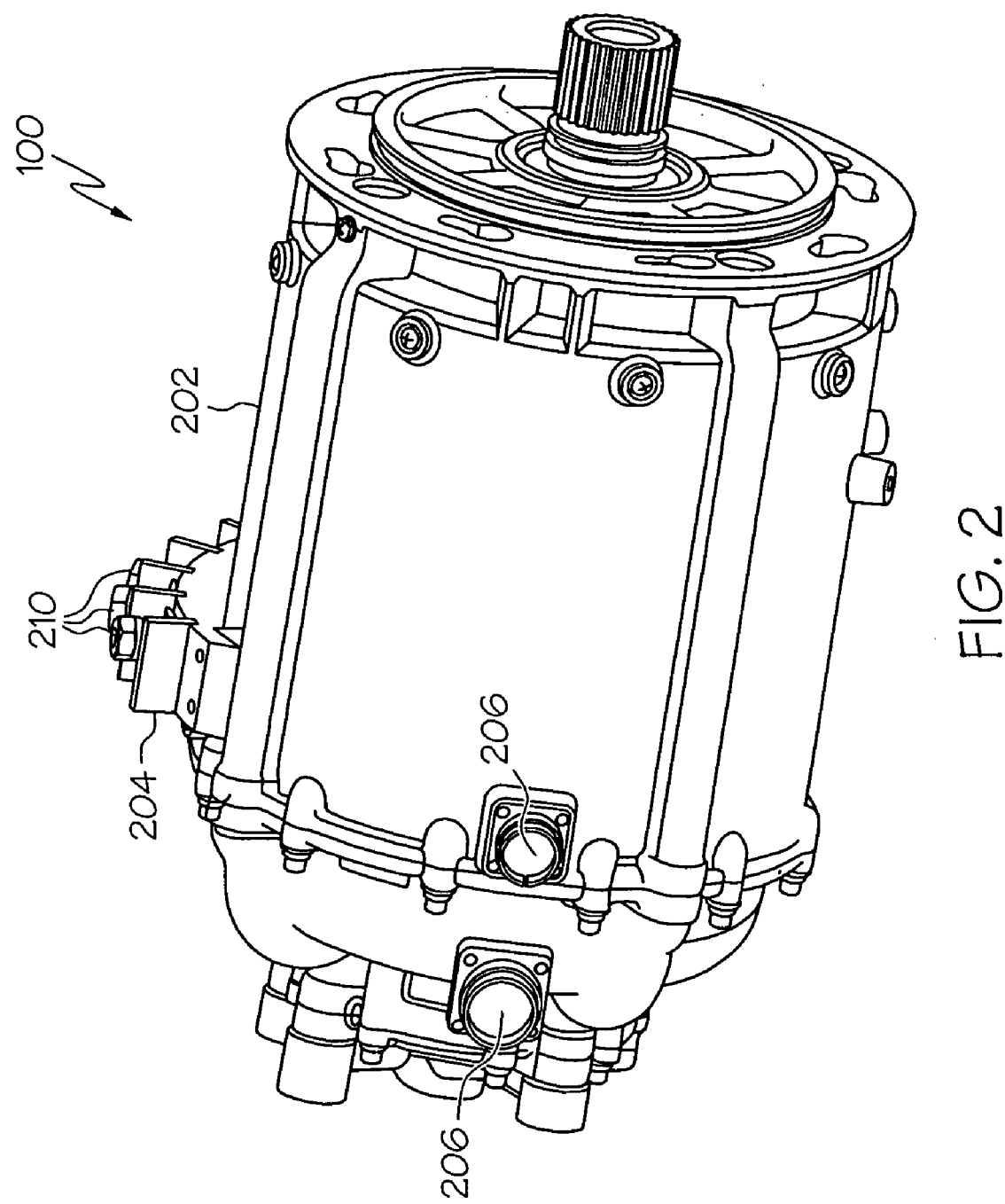
FIG. 2 is a perspective view of a physical embodiment of the generator system depicted in FIG. 1.

The generator system 100, or at least portions of the system 100, may be housed within a generator housing 202, a perspective view of which is illustrated in FIG. 2. A terminal block 204 and a pair of terminal plugs 206 and 208 are mounted on the generator housing 202, and provide the electrical interface to external equipment and systems. The terminal block 204 includes a plurality of main power terminals 210. The main power terminals 210 are electrically coupled to the main stator 134 and are used to electrically couple the generator 100 to, for example, a main power distribution system (not illustrated).

The terminal plugs 206, 208 include a plurality of non-illustrated pins that are electrically coupled to various circuits and windings within the generator system 100. The terminal plugs 206, 208 allow electrical test equipment to be electrically connected to selected pins to perform various electrical tests such as, for example, winding resistance tests, insulation resistance tests, and dielectric tests. As will be described in more detail further below, the terminal plugs 206, 208 are also used to electrically couple the various generator system circuits and windings to the electrical test box 300 that is shown in FIGS. 3A, 3B, and 4, and which is described in more detail further below.

Returning once again to FIG. 1, the shaft assembly 160 is preferably adapted to be coupled at one end to a non-illustrated prime mover such as, for example, a gas turbine engine. This end of the shaft assembly 160 thus may be referred to as the "drive end," while the other end of the shaft assembly 160 may be referred to as the "anti-drive end." The shaft assembly 160 is rotationally mounted within the generator housing 200 via at least two bearing assemblies. In the depicted embodiment, these bearing assemblies include a drive end (DE) bearing assembly 162 and an anti-drive end (ADE) bearing assembly 164. A bearing sensor 166 and 168 is associated with the DE bearing assembly 162 and the ADE bearing assembly 164, respectively. The bearing sensors 166, 168 may be any one of numerous types of sensors known in the art, and are configured to provide a signal to indicate when a bearing assembly is worn and should be replaced.

As noted previously, the generator system 100 may need to undergo periodic maintenance testing to determine the integrity of various circuits and windings therein. Accordingly, the generator 100 is coupled to the previously mentioned test box 300 via an adapter harness 402, which is illustrated in FIG. 4 and which will be described in more detail further below.

Figure 3A:
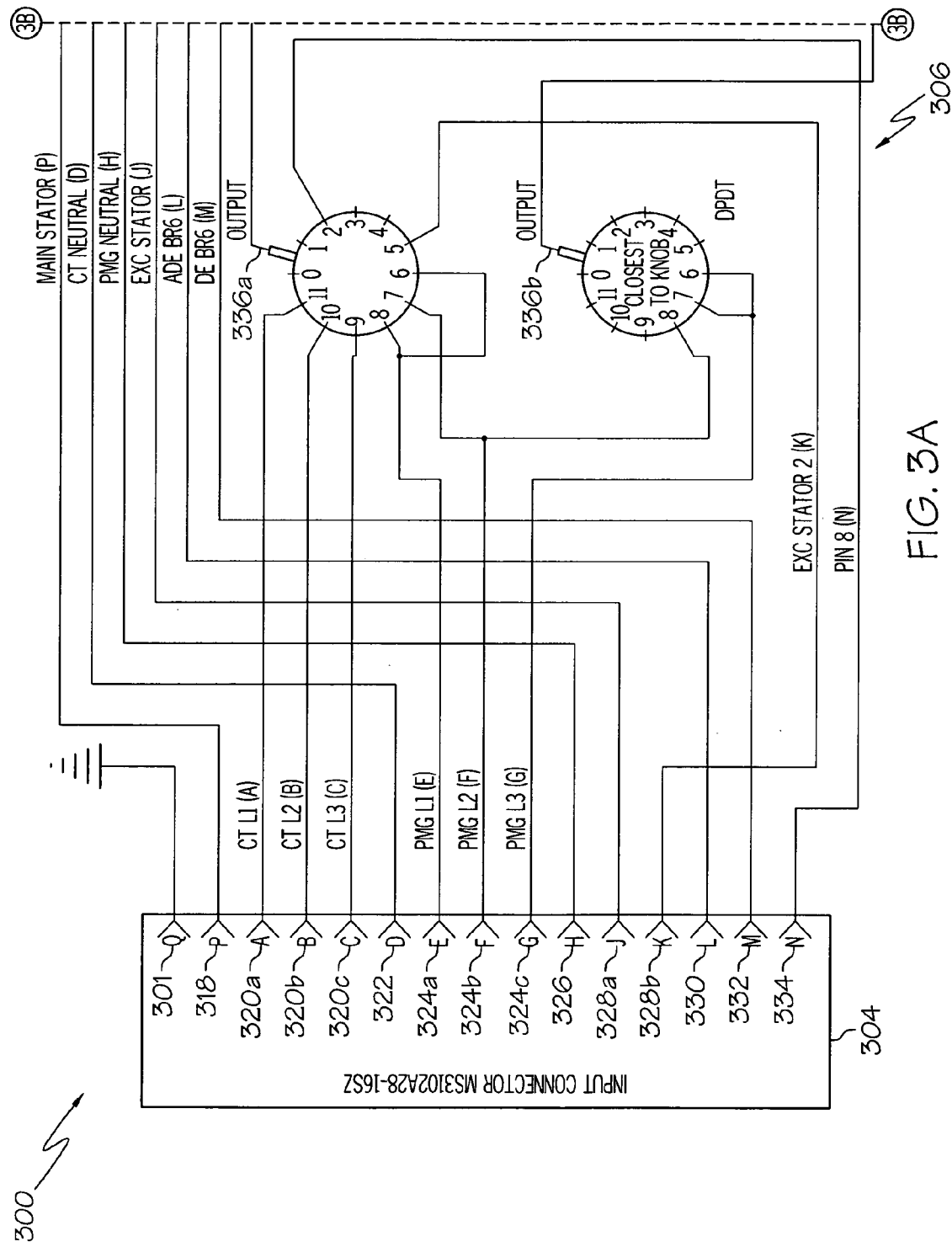
FIGS. 3A and 3B are schematics of an exemplary test box that may be used in the testing of the generator depicted in FIG. 2.
Figure 3B:
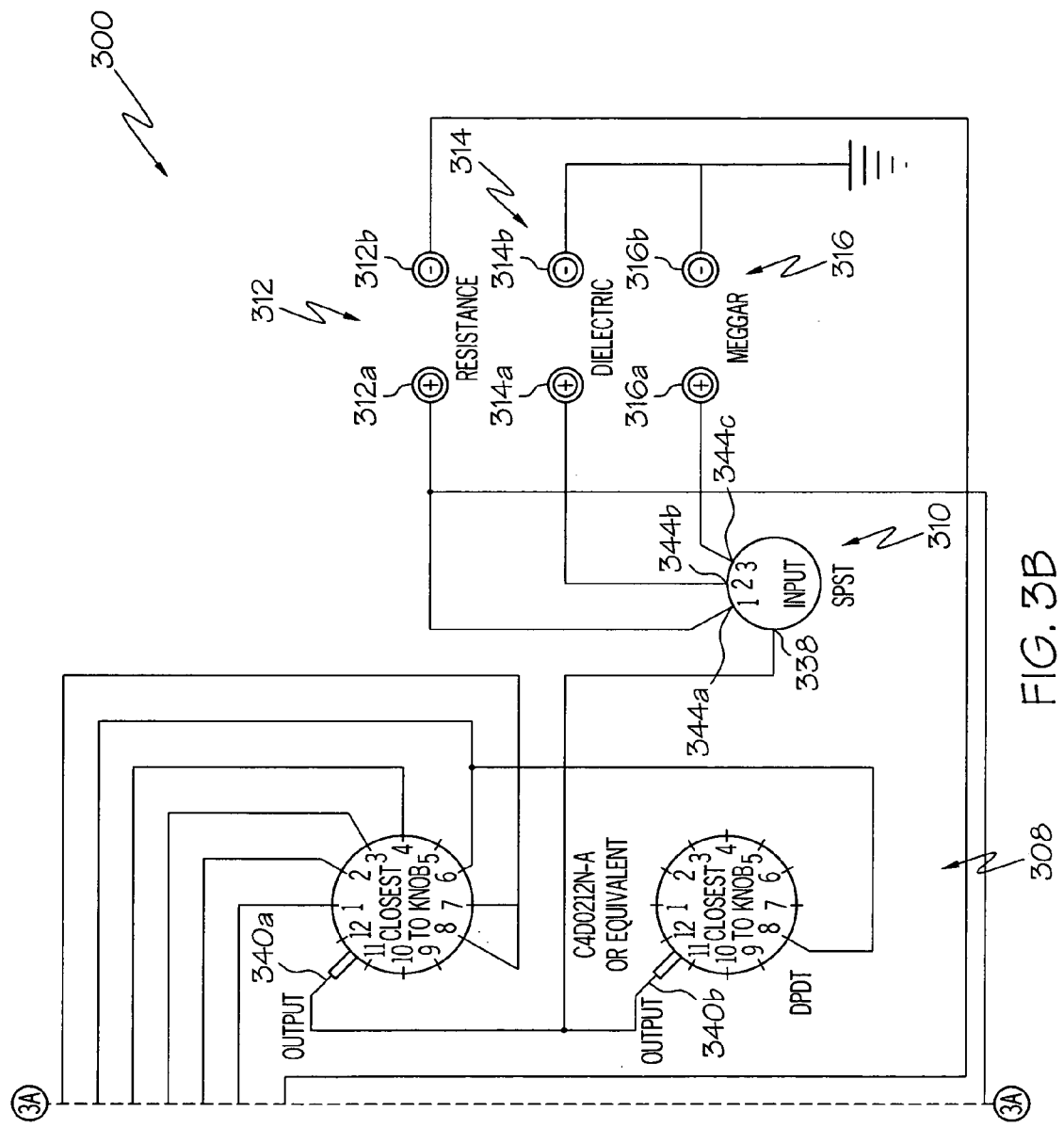
Figure 4:
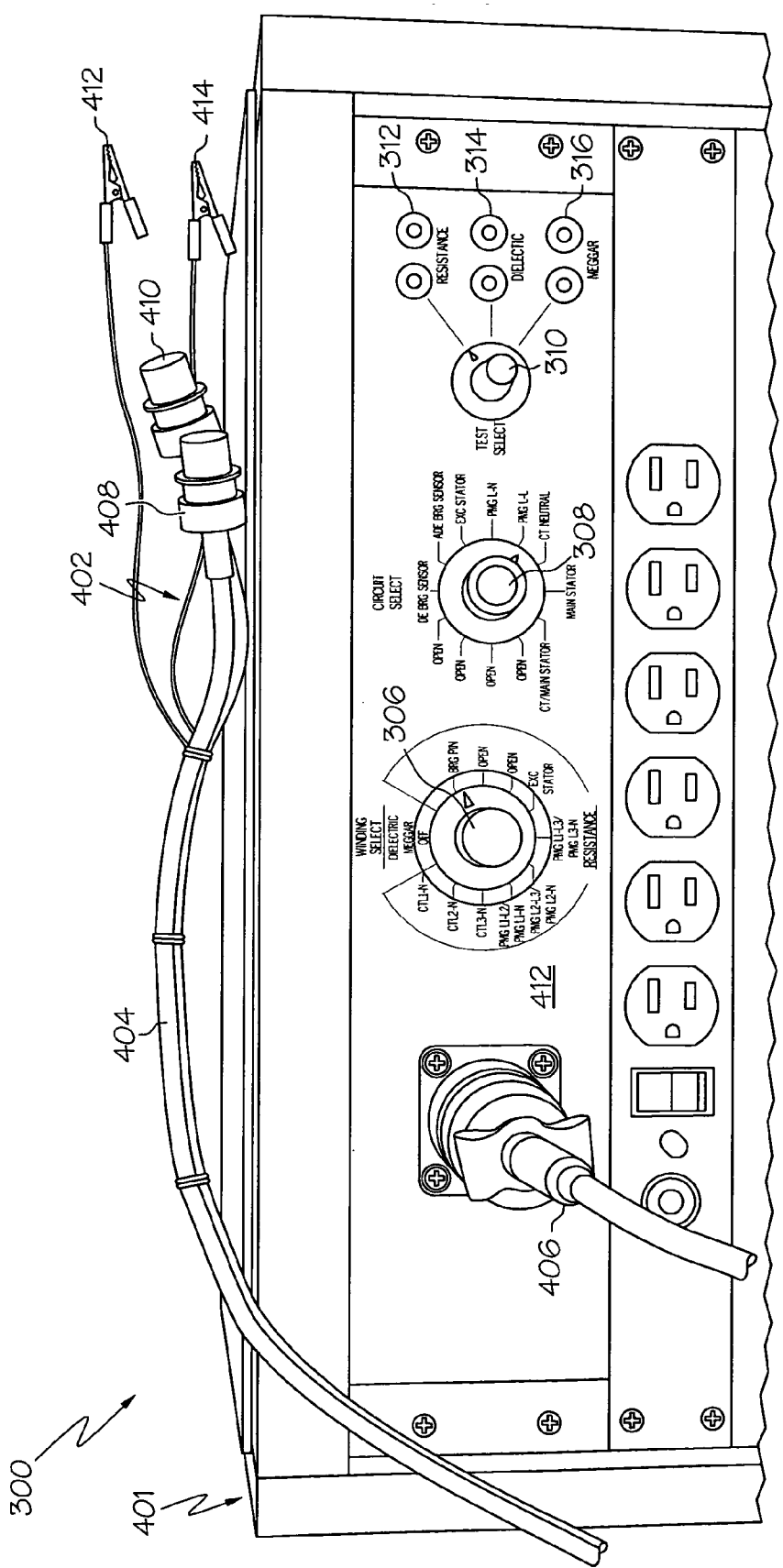
FIG. 4 is front view of the exemplary test box depicted in FIGS. 3A and 3B.

The test box 300, an exemplary embodiment of which is shown schematically in FIGS. 3A and 3B, serves as a single universal platform to connect the generator 100 to various test equipment used during periodic maintenance testing. With reference to FIGS. 3A and 3B, the exemplary test box 300 includes an input connector 304, a circuit select switch 306, a winding select switch 308, a test select switch 310, and three pair of test device jacks 312 (312a, 312b), 314 (314a, 314b), and 316 (316a, 316b). As will be described in more detail below, the input connector 304, via the adapter harness 402, provides the electrical interface between the generator system 100 to be tested and the test box 300. Once the test box 300 is electrically interfaced to the generator 100, the circuit select switch 306 is used to select a specific generator circuit to be tested, the winding select switch 308 is used to select, when needed for a specific test, specific windings or components associated with the selected circuit, and the test select switch 310 is used to electrically couple the selected circuit and/or windings to the pair of test jacks 312, 314, 316 associated with the test to be conducted. With continued reference to FIGS. 3A and 3B, a more detailed description of the depicted test box 300, and the particular depicted components that make up the depicted test box 300, will now be provided, beginning first with the input connector 304.

The input connector 304 includes a plurality of input pins, each of which is electrically coupled to the circuit select switch 306, the winding select switch 308, or ground. Although the specific number of input pins may vary, it will be appreciated that the input connector 304 includes a sufficient number of input pins so as to be capable of separately coupling a desired number of generator circuits and windings to the test device 300. In the depicted embodiment, the input connector 304 includes a ground pin 301, a main stator pin 318, three CT pins 320a–c, a CT neutral pin 322, three PMG pins 324a–c, a PMG neutral pin 326, two exciter stator pins 328a, b, an ADE bearing sensor pin 330, a DE bearing sensor pin 332, and a bearing sensor common pin 334. As is clearly seen in FIGS. 3A and 3B, the main stator pin 318, the CT neutral pin 322, the PMG neutral pin 326, one of the exciter stator pins 328a, the ADE bearing sensor pin 330, and the DE bearing sensor pin 332, are each coupled to the circuit select switch 306, whereas the CT pins 320a–c, the PMG pins 324a–c, the other exciter stator pin 328b, and the bearing sensor common pin 334 are each electrically coupled to the winding select switch 308. It will be appreciated that the depicted pins, and the electrical connections to each switch 306, 308, are merely exemplary, and that the specific pins may vary, depending on the particular type and configuration of generator 100 to be tested.

The circuit select switch 306 is used to select a particular circuit within the generator 100 to undergo a desired test. In the depicted embodiment, the circuit select switch 306 is implemented as a 12-position, double pole double throw (DPDT) switch. It will be appreciated, however, that this is merely exemplary, and that numerous other switch types and configurations could be used. With quick reference to FIG. 4 in combination with FIG. 3A, it is seen that the circuit select switch 306 is used to select the DE bearing sensor 166, the ADE bearing sensor 168, the exciter stator 122, the PMG rotor 112, the CTs 195, or the main generator stator 134 to undergo a specific electrical test. It is additionally seen that although the circuit select switch 306 is used to individually select one of six generator circuits, eight of the twelve switch positions are labeled. This is preferably done to accommodate brushless AC generators of varying types. For example, some generators are configured such that the main stator 132 and CTs 195 share a circuit neutral during electrical bench tests. This also accommodates various types of resistance measurements (i.e., line-to-line and line-to-neutral) associated with the PMG windings. Thus, in the depicted embodiment, the circuit select switch 306 includes switch positions that are labeled DE BRG SENSOR (to select the DE bearing sensor), ADE BRG SENSOR (to select the ADE bearing sensor), EXC STATOR (to select the exciter stator), PMG L-N (to select the PMG stator, for line-to-neutral measurements), PMG L-L (to select the PMG stator for line-to-line measurements), CT NEUTRAL (to select the CTs), MAIN STATOR (to select the main stator), and CT/MAIN STATOR (to select the CTs and the main stator, if these circuits share a circuit netural during electrical bench test).

No matter the particular number of circuits that the circuit select switch 306 is configured to select, it is seen that the switch includes a pair of output contacts 336 (336a and 336b), one for each pole. With reference to FIGS. 3A and 3B, it is seen that the circuit select switch output contacts 336 are electrically coupled to an input contact 338 on the test select switch 310. Thus, when the circuit select switch 306 is moved to, for example, the EXC STATOR position, the exciter stator 122 is electrically coupled to the test select switch 310. The function of the test select switch 310 is described more fully below. First, however, the winding select switch 308 will be described.

As noted above, the winding select switch 308 is used, when needed for a specific test, to select specific windings or components associated with the circuit that is selected by the circuit select switch 306. In the depicted embodiment, the winding select switch 308 is identical to the circuit select switch 306 in that it is implemented as a 12-position, double pole double throw (DPDT) switch. However, as with the circuit select switch 306, it will be appreciated that this is merely exemplary, and that numerous other switch types and configurations could be used. Again, with quick reference to FIG. 4 in combination with FIG. 3B, it is seen that the winding select switch 308 is used to individually select the bearing sensor common pin 334, the exciter stator winding, the PMG windings, or the individual CT windings. Thus, in the depicted embodiment, the winding select switch 308 includes switch positions that are labeled BRG PIN (to select the bearing sensor common pin), EXC STATOR (to select the exciter stator winding) PMG L1–L2/PMG L1–N, PMG L2–L3/PMG L2–N, PMG L1–L3/PMG L3–N (to select individual PMG windings), CT L1–N, CT L2–N, and CT L3–N (to select individual CT windings). As FIG. 4 additionally shows, the winding select switch 308 further includes a switch position labeled DIELECTRIC/MEGGAR/OFF. The purpose of this latter switch position will be described in more detail further below.

The winding select switch 308, similar to the circuit select switch 306, also includes a plurality of output contacts 340 (340a, 340b), one for each pole. The winding select switch output contacts 340a and 340b are electrically coupled to test jacks 312a and 312b, respectively. This test jack pair 312, as will be described more fully below, is used to conduct resistance measurements and is thus appropriately labeled RESISTANCE.

Turning now to the test select switch 310, this switch 310 is used to selectively couple the circuit select switch output contacts 326 to one test jack 312a, 314a, 316a in each pair of test jacks 312, 314, 316. In the depicted embodiment, the test select switch 310 is implemented as a three-position, single-pole single-throw (SPST) switch, and includes an input contact 338, and three output contacts 344a, 344b, 344c, also referred to herein as the RESISTANCE output contact 344a, the DIELECTRIC output contact 344b, and the MEGGAR output contact 344c, respectively. The input contact 338 is electrically coupled to the test select switch output contacts 340a, b and each output contact 344a, 344b, 344c is electrically coupled to one test jack 312a, 314a, 316a in each test jack pair 312, 314, 316. The test select switch 310 has three positions labeled RESISTANCE, DIELECTRIC, and MEGGAR. In the RESISTANCE position, the test select switch 310 electrically couples the circuit select switch output contacts 336, and thus the generator circuit selected on the circuit select switch 306, to one of the test jacks 312a in the test jack pair 312 that, as FIGS. 3B and 4 both show, are also labeled RESISTANCE. Similarly, in the DIELECTRIC position, the test select switch 310 electrically couples the circuit select switch outputs contacts 336 to one of the test jacks 314a in the test jack pair 314 labeled DIELECTRIC, and in the MEGGAR position, the test select switch 310 electrically couples the circuit select switch outputs contacts 336 to one of the test jacks 316a in the test jack pair 316 labeled MEGGAR. A more detailed discussion of the test jack pairs 312–316, and the electrical interconnections thereof, will now be described.

The test jack pairs 312, 314, 316 are configured to receive a pair of test device leads that are in turn preferably coupled to one or more test devices. As was just noted, and as FIGS. 3B and 4 show, the test jack pairs 312, 314, and 316 are labeled RESISTANCE, DIELECTRIC, and MEGGAR, respectively. One RESISTANCE test jack 312a is electrically coupled to the test select switch RESISTANCE output contact 344a and one of the winding select switch output contact 340a, and the other test jack 312b is coupled to the other winding select switch output contact 340b. One DIELECTRIC test jack 314a is electrically coupled to the test select switch DIELECTRIC output contact 344b, and the other DIELECTRIC test jack 314b is electrically coupled to ground. One MEGGAR 316a is electrically coupled to the test select switch MEGGAR output contact 344c, and the other MEGGAR test jack 316b is electrically coupled to ground.

As alluded to previously, and as the previously mentioned nomenclature suggests, the RESISTANCE test jack pair 312 is used to conduct circuit resistance measurements. Similarly, the DIELECTRIC test jack pair 314 is used to conduct circuit dielectric tests, and the MEGGAR test jack pair 316 is used to conduct insulation resistance tests using, for example, a meggar. Although the test box 300 is depicted and described herein as including three test jack pairs 312, 314, 316, to which test equipment may be electrically coupled to conduct the three specific circuit tests just mentioned, it will be appreciated that the test box 300 could be configured to include more than this number of test jack pairs to conduct additional circuit tests, if needed or desired.

With reference now to FIG. 4, the previously mentioned adapter harness 402 is shown coupled to the input connector 304. As was also previously mentioned, the adapter harness 402 is used to couple the test box 300 to the generator 100. The circuitry of test box 300 is housed within a housing 401, which includes a user interface panel 412 on which the circuit select switch 306, the winding select switch 308, the test select switch 310, and the test jack pairs 312, 314, 316 are all mounted. The adapter harness 402 includes a plurality of conductors (not visible) disposed within a non-conductive sheath 404. The conductors are electrically coupled at one end to a test box connector 406, and at a second end to a first generator connector 408, a second generator connector 410, or one of two clips 412, 414. The test box connector 406, as is shown in FIG. 4, is used to couple the adapter harness 402 to the test box input connector 304. Though not depicted in FIG. 4, the first generator connector 408 is configured to couple to one of the generator terminal plugs 206, the second generator connector 410 is configured to couple to the other generator terminal plug 208, and the alligator clips 412 and 414 are configured to selectively couple to a terminal on the terminal block 204 and the generator housing 202, respectively.

Thus, the first and second generator connectors 408, 410 and the two clips 412, 414 are used to electrically couple the various generator system circuits and windings to the appropriate input pins 318–334. More specifically, at least in the depicted embodiment, the first generator connector 408 is used to couple the CTs 195 to the four CT pins 320a–c, 322 on the input connector 304, the second generator connector 410 is used to couple the PMG windings, the exciter stator windings and the ADE and the DE bearing sensors 168, 166 to the PMG pins 324a–c, 326, the exciter stator pins 328a, b, the ADE bearing sensor pin 330, the DE bearing sensor pin 332, and the bearing sensor common pin 334, as appropriate. One of the clips 412 is used to couple the main stator windings to the main stator pin 318, and the other clip 414 is used to as a ground clip. It will be appreciated that adapter harness 402 depicted and described herein is merely exemplary of a particular embodiment that is used for a particular type of generator, such as the one shown in FIG. 1, and that other adapter harness configurations may be implemented for use with various other generator configurations.

Having described the test box 300 from a functional standpoint, the electrical interconnections of the various components that make up the test box 300, and a particular physical embodiment of the test box 300, a description will now be provided of the operation of the test box 300 when used to test the circuits within an AC generator system 100, such as the one shown in FIG. 1. In doing so, reference should be made to FIGS. 3A, 3B, and 4, as necessary. Moreover, although the following describes the tests as being implemented in a specific order, it will be appreciated that this is merely exemplary, and that the tests may be performed either alone or in various sequences.

When a particular generator 100, such as the one shown in FIG. 1, is to be tested, the appropriate adapter harness 402 is coupled to the test box 300 and to the generator test plugs 206, 208, terminal block 204, and generator housing 202. Then, to take circuit resistance measurements, the circuit select switch 306 and the winding select switch 308 are each set to the desired position for the specific circuit to be tested. As shown in FIGS. 3A and 3B, this electrically couples one leg of the selected circuit to one of the RESISTANCE test jacks 312b, and electrically couples the other leg of the circuit to the test select switch input contact 338. Thereafter, the test select switch 310 is moved to the RESISTANCE position, which electrically couples the other leg of the selected circuit to the other RESISTANCE test jack 312a. For example, if the resistance of the exciter stator windings is to be tested, the circuit select switch 306 and the winding select switch 308 are each moved to the EXC STATOR positions, and the test select switch 310 is moved to the RESISTANCE position. With an ohmmeter, or other resistance test device, coupled to the RESISTANCE test jack pair 312, the resistance of the windings can thus be measured. The positions of the circuit select switch 306 and the winding select switch 308 may be changed to measure the various other winding resistances.

When all the resistance tests are completed, the test box 300 may then be used to conduct dielectric and insulation tests of the various generator circuits. To conduct these latter two tests, the winding select switch 308 is moved to the DIELECTRIC/MEGGAR/OFF position. In this position, those portions of the generator circuits electrically coupled to the winding select switch 308 are electrically isolated from the RESISTANCE test jack pair 312. Thereafter, the circuit select switch 306 is moved to the desired circuit position, the test select switch 310 is moved to the desired position (i.e., the DIELECTRIC position or MEGGAR position), and the desired test is then performed on the selected circuit. As shown most clearly in FIG. 3B, one test jack 314b and 316b in the DIELECTRIC and MEGGAR test jack pair 314 and 316, respectively, are electrically coupled to ground, and the remaining test jack 314a, 316a is electrically coupled to the test select switch 310.

For example, if the leakage current of the exciter stator 122 is to be tested, the winding select switch 308 is moved to the DIELECTRIC/MEGGAR/OFF position, the circuit select switch 306 is moved to the EXC STATOR position, and the test select switch 310 is moved to the MEGGAR position. With a capacitance circuit tester coupled to the MEGGAR test jack pair 314, the insulation resistance of the exciter stator 122 can thus be measured. The positions of the circuit select switch 306 may be changed to measure the various other insulation resistances. Testing the insulation resistance of the various generator circuits is conducted similar to this except the test select switch 310 is moved to the MEGGAR position, and a Meggar is coupled to the MEGGAR test jack pair 316. The Meggar is then used to measure the circuit insulation resistance.

Those with skill in the art will appreciate that the steps of the methods described above may be performed in any order. Moreover, the methods may be modified in accordance with appropriate operation of other test devices.

Thus, a device for testing a generator and a method for using the device have been provided that do not require disassembly of the generator, and/or is less labor-intensive, and/or less time-consuming, and/or capable of being used for testing generators of various sizes and configurations.

While the invention has been described with reference to a preferred embodiment, it will be understood by those skilled in the art that various changes may be made and equivalents may be substituted for elements thereof without departing from the scope of the invention. In addition, many modifications may be made to adapt to a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

I claim:

1. An electrical test box for selectively connecting a generator to one of a plurality of test devices, the generator having a plurality of circuits, the electrical test box comprising:
    an input connector adapted to electrically couple to one or more of the circuits;
    one or more pair of test jacks;
    a circuit select switch having a plurality of input contacts and an output contact, the circuit select switch input contacts electrically coupled to the input connector and configured to selectively electrically couple the circuit select switch output contact to a generator circuit;
    a winding select switch having a plurality of input contacts and an output contact, the circuit select switch input contacts electrically coupled to the input connector and at least one of the test jacks, the winding select switch configured to selectively couple the winding select switch output contact to one test jack of the test jack pair; and
    a test select switch electrically coupled between the circuit select switch output contact and at least one of the test jacks, the test select switch configured to selectively couple the circuit select switch output contact to one test jack of the test jack pair.

2. The electrical test box of claim 1, wherein the circuit select switch comprises a double pole double throw switch.

3. The electrical test box of claim 1, wherein the winding select switch comprises a double pole double throw switch.

4. The electrical test box of claim 1, wherein at least one of the one or more pair of jacks is configured to couple to a circuit resistance test device.

5. The electrical test box of claim 4, wherein at least one of the one or more pair of jacks is configured to couple to a circuit dielectric test device.

6. The electrical test box of claim 5, wherein at least one of the one or more pair of jacks is configured to couple to an insulation resistance test device.

7. The electrical test box of claim 1, further comprising an adapter harness coupled to the input connector.

8. The electrical test box of claim 7, wherein the adapter harness is configured to couple the electrical test box to the generator.

9. The electrical test box of claim 8, wherein the generator includes a first and a second terminal plug and a terminal block and the adapter harness comprises:

a first generator connector configured to couple to the first terminal plug;

a second generator connector configured to couple to the second terminal plug; and a pair of clips configured to couple to the terminal block and the generator, respectively.

10. The electrical test box of claim 1, further comprising a housing within which at least the circuit select switch and test select switch are disposed.

* * * * *